United States Patent
Pfaffinger et al.

(10) Patent No.: US 11,284,551 B2
(45) Date of Patent: Mar. 22, 2022

(54) METHOD AND DEVICE FOR DETERMINING THE MAXIMUM NUMBER OF CONSTANT TABLES IN A PLURALITY OF PICK-AND-PLACE LINES HAVING PICK-AND-PLACE MACHINES

(71) Applicant: Siemens Aktiengesellshaft, Munich (DE)

(72) Inventors: Alexander Pfaffinger, Munich (DE); Christian Royer, Ottobrunn (DE)

(73) Assignee: SIEMENS AKTIENGESELLSCHAFT

(*) Notice: Subject to any disclaimer, the term of this patent is extended or adjusted under 35 U.S.C. 154(b) by 184 days.

(21) Appl. No.: 16/321,838

(22) PCT Filed: Aug. 3, 2016

(86) PCT No.: PCT/EP2016/068527
§ 371 (c)(1),
(2) Date: Jan. 30, 2019

(87) PCT Pub. No.: WO2018/024326
PCT Pub. Date: Feb. 8, 2018

(65) Prior Publication Data
US 2019/0166735 A1 May 30, 2019

(51) Int. Cl.
*H05K 13/08* (2006.01)
*H05K 13/04* (2006.01)

(52) U.S. Cl.
CPC ....... *H05K 13/085* (2018.08); *H05K 13/0404* (2013.01); *H05K 13/0417* (2013.01); *H05K 13/0495* (2013.01); *Y10T 29/4913* (2015.01)

(58) Field of Classification Search
CPC .. H05K 13/085; H05K 13/0404; H05K 13/08; H05K 13/0015; H05K 13/00;
(Continued)

(56) References Cited

U.S. PATENT DOCUMENTS 8,151,448 B2* 4/2012 Vermeer ............ H05K 13/0434
29/739
8,793,008 B2* 7/2014 Bauer .................. H05K 13/085
700/111
(Continued)

FOREIGN PATENT DOCUMENTS

| CN | 104412729 A | 3/2015 |
| CN | 104412733 A | 3/2015 |

(Continued)

OTHER PUBLICATIONS

PCT International Search Report corresponding to PCT International Application No. PCT/EP 2016/068527 filed Mar. 8, 2016.

*Primary Examiner* — Thiem D Phan
(74) *Attorney, Agent, or Firm* — Schmeiser, Olsen & Watts LLP

(57) ABSTRACT

Provided is a method for determining the maximum number of constant tables at table locations in one or more pick-and-place lines for the placement of components on modules using pick-and-place machines, the fittings on the constant tables being used in all the fitting families of a pick-and-place line, one fitting family including a set of modules which can be produced on a pick-and-place line with a common component fitting, wherein the maximum number of constant tables is determined by calculation using mixed-integer liner optimization on the basis of input data describing the pick-and-place infrastructure, wherein the pick-and-place infrastructure can include in particular the pick-and-place lines having the pick-and-place machines, each with pick-and-place head, at least one transport system for the modules, the said constant tables, and further tables which can be variably fitted.

8 Claims, 1 Drawing Sheet

(58) Field of Classification Search
CPC ........... H05K 13/0882; H05K 13/0061; H05K 13/04; G05B 2219/45026; G05B 2219/45063; Y10T 29/53178; Y10T 29/53365; Y10T 29/534; Y10T 29/4913
USPC .............. 29/832, 33 K, 564.1, 729, 739, 829
See application file for complete search history.

(56) References Cited

U.S. PATENT DOCUMENTS

| | | |
|---|---|---|
| 9,955,620 B2 | 4/2018 | Royer |
| 10,061,306 B2 | 8/2018 | Craiovan et al. |
| 2015/0160648 A1 | 6/2015 | Craiovan et al. |
| 2015/0195966 A1 | 7/2015 | Pfaffinger et al. |
| 2015/0296671 A1 | 10/2015 | Pfaffinger et al. |
| 2018/0324991 A1 | 11/2018 | Pfaffinger et al. |

FOREIGN PATENT DOCUMENTS

| | | |
|---|---|---|
| DE | 102009013353 B3 | 10/2010 |
| DE | 102012211810 A1 | 2/2014 |
| EP | 2409556 A1 | 1/2012 |
| WO | 2014005744 A1 | 1/2014 |
| WO | WO 2014005744 A1 | 1/2014 |
| WO | 2016091527 A1 | 6/2016 |

* cited by examiner

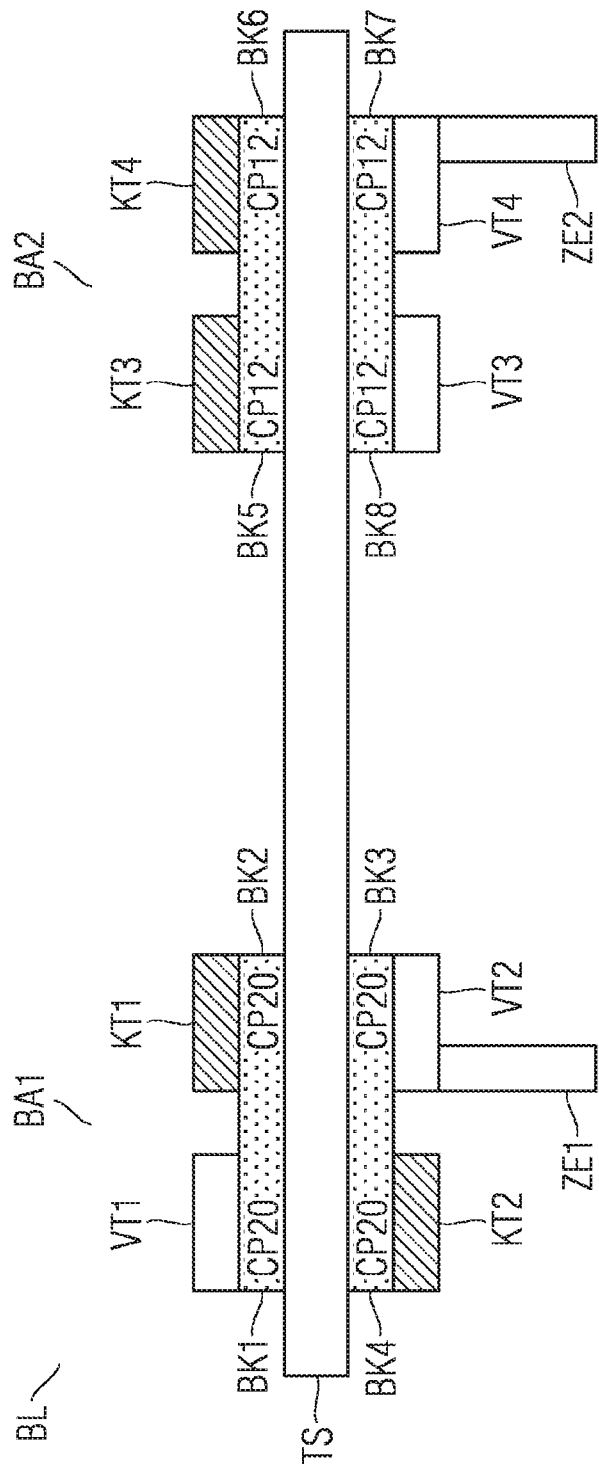

METHOD AND DEVICE FOR DETERMINING THE MAXIMUM NUMBER OF CONSTANT TABLES IN A PLURALITY OF PICK-AND-PLACE LINES HAVING PICK-AND-PLACE MACHINES

CROSS-REFERENCE TO RELATED APPLICATIONS

This application claims priority to PCT Application No. PCT/EP2016/068527, having a filing date of Aug. 3, 2016, the entire contents of which are hereby incorporated by reference.

FIELD OF TECHNOLOGY

The following relates to a method and a device for determining the maximum number of constant tables at table locations in a plurality of pick-and-place lines having pick-and-place machines, wherein the fittings on the constant tables are used in all the fitting families.

BACKGROUND

A fitting family, also called cluster, comprises a set of batches which can be produced within a fitting. This means that the total amount of component types required for this purpose can be accommodated on the table locations available to the line. All assemblies of a fitting family can thus be produced successively without converting the set-up on the line.

Furthermore, embodiments of the invention relate to a device for a pick-and-place or production or mounting line for the placement of components on assemblies. Moreover, embodiments of the invention relate to a computer program product and a computer-readable medium.

Particularly in the field of electronics production, printed circuit boards or assemblies to be produced are manufactured on SMT pick-and-place lines by surface mounting (surface mounted technology, SMT). One manufacturer of SMT pick-and-place machines and systems bearing the product name SIPLACE is for example ASM (http://www.siplace.com/en/Home).

A plurality of pick-and-place machines which are usually connected by a transport system, and which interact e.g. in order to produce electronic parts, constitute a pick-and-place line.

In the case of pick-and-place machines e.g. for the placement of components on assemblies, feed devices for components are arranged laterally at a transport path for the assembly. A pick-and-place head of the pick-and-place machine, said head being movable by a positioning system, picks up the components from the feed devices, moves them to a pick-and-place region of the pick-and-place machine, in which the assembly to be populated is provided, and places the components on the assembly. By way of example, so-called belt feeders suitable for transporting and feeding components mounted in belts are used for providing the components. They transport the components magazine-stored in pocketlike depressions to a pick-up position, at which the components are picked up from the belt pockets by the pick-and-place head. The empty belt leaves the feed device at a suitable point.

During the pick-and-place process, the printed circuit board or assembly is usually stationary in relation to the pick-and-place machine. The shuttle tables each comprise a multiplicity of feed units. Each feed unit keeps ready a supply of components of a predetermined component type. For the components, the feed unit has a volumetric capacity (space capacity), which is usually expressed in tracks or track capacities. A track is usually 8 mm wide and the number of tracks of each feed unit is limited, for example to 40. Components of the same component type are usually provided in a belt, on a tray or in a tube. Each component type requires a predetermined number of tracks from the feed unit, which tracks must usually adjoin one another.

Each feed unit can be configured for keeping ready different components and different feed units can usually be fitted to a shuttle table. If a component of a component type that is not present in one of the shuttle tables is required at a specific pick-and-place machine, then it is usually the case that rather than one of the fitted shuttle tables being provided with the required components, it is completely exchanged for another, appropriately equipped shuttle table. Equipping an exchangeable shuttle table with components 155 is called prefitting and may require a processing time in the hours range.

Furthermore, it is known from electronics production, for example, to combine the batches to be produced on a pick-and-place line in fitting families. All batches of a fitting family are produced in each case with the same line fitting. Constant tables here are fixedly set-up and fixedly fitted tables that are identical for all fittings of the fitting families. The concept of the constant tables reduces the outlay for set-up conversion and makes it possible to save fitting equipment.

The productions are often also operated in mixed fashion, wherein one portion of the assemblies is produced in the production with constant tables and another portion of the assemblies is produced in the production with tables which can be variably fitted or variable tables on the same pick-and-place line. Owing to the lower outlay for planning, storage, prefitting and set-up conversion, endeavors are generally made to increase the proportion of constant tables and to reduce the proportion of variable tables.

Nowadays the fittings of the constant tables are determined by a production planner in each case with an individual strategy based on the production planner's experience and more or less by trial and error. The associated time expenditure is very high and the results are often unsatisfactory.

DE 10 2009 013 353 discloses a method for determining optimum component fittings for constant tables of pick-and-place machines in pick-and-place lines at fixedly predefined table locations, wherein the fittings on the constant tables are used in all the fitting families, wherein a fitting family in this case comprises a set of batches which are produced within a fitting.

The use of mathematical optimization methods is effective for this determination of optimum component fittings for constant tables. Said optimization methods are generally linear optimization methods or procedures. Linear optimization is concerned with the optimization of linear target functions over a set limited by linear equations and inequalities. It is the basis of the solution procedures of (mixed) integer linear optimization. A so-called solver is a collective term for specific mathematical computer programs which can solve mathematical problems numerically. In association with MIP (mixed integer linear programming), standard solvers such as e.g. CPLEX, Gurobi, Ilog, Xpress can be used for small IP programs (integer optimization models).

The method can be used to determine constant table fittings at predefined table locations. This type of determination is not suitable for calculating the maximum number of constant tables, however, since already for 10 tables with 1023 configurations this method is practically no longer implementable, and if it is, then it is extremely intensive in respect of computing time.

SUMMARY

An aspect relates to determining the maximum number of constant tables at table locations in one or more pick-and-place lines for the placement of components on assemblies with the aid of pick-and-place machines, wherein the fittings on the constant tables are used in all the fitting families of a pick-and-place line, wherein a fitting family comprises a set of assemblies which can be produced on a pick-and-place line with a common component fitting, wherein the maximum number of constant tables is determined by means of calculation with the aid of mixed integer linear optimization on the basis of input data describing the pick-and-place infrastructure, wherein the pick-and-place infrastructure can comprise in particular the pick-and-place lines having the pick-and-place machines, each having pick-and-place heads, at least one transport system for the assemblies, said constant tables and further tables which can be variably fitted.

The following data can be used as input data:
set of component types,
set of assembly types,
set of component types per assembly type,
track occupation per component type,
maximum track capacity per table,
set of tables of a pick-and-place line,
set of permissible component types per table.

Furthermore, the following parameters can be used as predefinable input parameters for calculating the maximum number of constant tables:
the maximum degree of filling for the constant tables (KT1-KT4);
the maximum degree of filling for the tables (VT1-VT4) which can be variably fitted.

A further aspect of embodiments of the invention is that the tables with maximum total track capacity (sum of the track capacities) are selected as constant tables. This affords the advantage that the table locations with the highest or maximum track capacities can be used in the case of a calculated maximum number of constant tables or if the maximum number of constant tables has been determined.

Minimum clusters can be predefinable as further input data for calculating the maximum number of constant tables (KT1-KT4), wherein a minimum cluster comprises a set of assembly types which have to be produced together in a fitting family.

One example of minimum clusters would be that in each case the top sides and undersides of a printed circuit board type are to be produced together in a cluster.

A further aspect of embodiments of the invention provides a device for determining the maximum number of constant tables (KT1-KT4) at table locations in one or more pick-and-place lines (BL) for the placement of components on assemblies with the aid of pick-and-place machines, wherein the fittings on the constant tables are used in all the fitting families of a pick-and-place line, wherein a fitting family comprises a set of assemblies which can be produced on a pick-and-place line with a common component fitting, comprising:
a pick-and-place infrastructure, which can comprise in particular the pick-and-place lines having the pick-and-place machines, each having pick-and-place heads, at least one transport system for the assemblies, said constant tables and further tables which can be variably fitted, and
a calculation unit designed to determine the maximum number of constant tables by means of calculation with the aid of mixed integer linear optimization on the basis of input data describing the pick-and-place infrastructure.

The device can provide means and/or units or facilities and/or modules for carrying out the abovementioned method which can be fashioned in each case as hardware and/or as firmware and/or as software or as a computer program or a computer program product (non-transitory computer readable storage medium having instructions, which when executed by a processor, perform actions).

The device can be correspondingly developed like the method described above.

A further aspect of embodiments of the invention provides a production or mounting line arrangement comprising such a device according to embodiments of the invention.

This production or mounting line arrangement can be part of an installation.

The installation can be characterized inter alia by one of the following installation types. Examples thereof are:
an automation installation,
a manufacturing or production installation,
a cleaning installation,
a water treatment installation,
an apparatus or a machine,
a flow machine,
an energy generating installation,
an energy network,
a communication network,
a medical device or apparatus,
a hospital information system.

A further aspect of embodiments of the invention is a computer program product or a computer program comprising means or device such as software, firmware, microcode, hardware, processors, integrated circuits, etc. in standalone operation or in arbitrary combination for carrying out the abovementioned method when the computer program (product) is executed in an abovementioned device or in means of the device. The computer program or computer program product can be stored on a computer-readable medium. The computer program or computer program product can be created in a customary programming language (e.g. C++, Java). The processing unit can comprise a commercially available computer or server having corresponding input, output and storage means. Said processing unit can be integrated in the device or in the means thereof.

Further advantages, details and developments of embodiments of the invention will become apparent from the following description of exemplary embodiments in association with the drawing.

BRIEF DESCRIPTION

Some of the embodiments will be described in detail, with references to the following FIGURES, wherein like designations denote like members, wherein:
The FIGURE shows one exemplary configuration of a pick-and-place line having two pick-and-place machines.

DETAILED DESCRIPTION

The pick-and-place machine BA1 consists of four conveying tables KT1, KT2, VT1, VT2, of which two are variable tables VT1, VT2 and two are constant tables KT1, KT2. Furthermore, the pick-and-place machine BA1 consists of four pick-and-place heads BK1-BK4, each of the CP20 type. The pick-and-place heads BK1-BK8 of a pick-and-place machine BA1, BA2 pick up the components from the feed devices ZE1, ZE2 and move them to a pick-and-place region of the pick-and-place machine BA1, BA2, where the assembly to be equipped (e.g. a base board in SMD production) is provided, and places the components on the assembly. The pick-and-place heads BK1-BK8 are usually movable by a positioning system. By way of example, so-called belt feeders can be used as feed devices ZE1, ZE2 for providing the components.

The pick-and-place machine BA2 having two variable tables VT3, VT4 and two constant tables KT3, KT4 is likewise arranged at the transport system TS that provides the base board. Furthermore, the pick-and-place machine BA2 consists of four pick-and-place heads BK5-BK8, each of the CP12 type.

The FIGURE illustrates by way of example that the variable tables VT2 and VT4 have feed devices ZE1 and ZE2, respectively, for providing the components to be mounted (e.g. chips, transistors, etc.).

In SMD production (e.g. for electronic components), pick-and-place machines BA1, BA2 are used for populating printed circuit boards (assemblies), which pick-and-place machines place components from feed devices ZE1, ZE2 onto the printed circuit boards with the aid of a pick-and-place head BK1-BK8. The printed circuit boards are provided at the pick-and-place machines BA1, BA2 by the transport system TS.

Usually (e.g. in electronics production), the batches to be produced on a pick-and-place line are combined in fitting families. All batches of a fitting family are produced in each case with the same line fitting.

Constant tables KT1-KT4 are fixedly set-up and fixedly fitted tables that are identical for all fittings of the fitting families (clusters). It is thus possible to reduce outlay for set-up conversion for the production volume produced with variable fittings and to save fitting equipment.

A variable table VT1-VT4 is understood to mean a shuttle or conveying table which is assigned to a station side of a pick-and-place machine and in which the fittings need not be constant for all fitting families, but rather can vary, i.e. can be altered. Variable tables VT1-VT4 have to be exchanged as necessary. This means outlay for set-up conversion. Furthermore, variable tables VT1-VT4 are kept ready for exchange. This causes a high storage space requirement.

The method for determining the maximum number of constant tables KT1-KT4 is based on the mathematical method of integer linear optimization (integer linear programming) or mixed integer linear optimization (mixed integer linear programming, MIP).

As a mathematical optimization method, a description is given below of (linear) IP models (IP stands for integer programming or for integer program or integer optimization model) and MIP models (mixed integer linear optimization (mixed integer linear programming)) for this problem posed. The use of exact mathematical methods makes it possible to achieve significantly better solutions than with heuristics or optimization methods used hitherto. IP solution approaches have the following advantages:

Global optimization approach.
Easily extendible.
Very good commercial standard solvers (e.g. Ilog, Gurobi) which are widely used and proven in practice.

The standard solvers are being constantly improved, and so it should be expected that the entities can be solved even more rapidly in the future.

The maximum number of constant tables in a plurality of pick-and-place lines having pick-and-place machines can be ascertained or determined by a unit that is not illustrated in the FIGURE. Such a unit can be integrated into a pick-and-place machine, e.g. BA1, of the pick-and-place line BL. Said unit can also be implemented or integrated in a computer which is separated from the pick-and-place machines and which controls the pick-and-place machines.

The IP model illustrated should be regarded merely as one possible exemplary formulation and does not constitute a restriction for the method.

The objective criterion is formulated by a linear expression that is to be maximized or minimized.

In the exemplary embodiment, the following input data or input parameters are used in the IP model:

Mixed integer linear optimization models (MIP, mixed integer program) are proposed with which the number of maximum possible constant tables or the maximum total track capacity thereof can be estimated very rapidly and exactly.

The following designations are applicable in the MIP formulation:

| Indices | |
|---|---|
| C | Set of component types |
| R | Set of assembly types |
| $R_c$ | Set of assemblies having component type c |
| Parameters | |
| $Width_c$ | Space occupation of a component type c |
| Cap | Line capacity of tracks |
| Binary variables | |
| $SetupConst_c$ | Variable indicating whether the component type c is fitted on the constant tables. It assumes the value 1 in this case, otherwise the value 0. |
| $SetupVar_{c,r}$ | Variable indicating whether the component type c is fitted in the variable fitting portion for the assembly type r. It assumes the value 1 in this case, otherwise the value 0. |

Estimators for the maximum total track capacity of the constant tables:

Continuous Variables:
$CapVar_r$ Track requirement for the variable fitting portion of the assembly type r
CapConst Total track capacity of the constant tables $$\text{Maximize CapConst}$$

Under the Condition:

| | |
|---|---|
| (1) $SetupConst_c + SetupVar_{r,c} = 1$ | $c \in C, r \in R_c$ |
| (2) $CapConst + CapVar_r \leq Cap$ | $r \in R$ |
| (3) $\sum_{c \in C} Width_c SetupVar_{c,r} \leq CapVar_r$ | $r \in R$ |
| (4) $\sum_{c \in C} Width_c SetupConst_c \leq CapConst$ | |
| $SetupConst_c \in \{0, 1\}$ | $c \in C$ |
| $SetupVar_{c,r} \in \{0, 1\}$ | $c \in C, r \in R_c$ |
| $CapVap_r \geq 0$ | $r \in R$ |
| $CapConst \geq 0$ | |

Re (1): For an assembly type, all component types contained must be situated either in the constant fitting portion or in the variable fitting portion.

Re (2): The sum of the total track capacities for the constant fitting portion and for a variable fitting portion must not exceed the line capacity.

Re (3): The sum of the track widths of the component types in the variable fitting portion of an assembly type must not exceed the capacity thereof.

Re (4): The sum of the track widths of the component types in the constant fitting portion must not exceed the capacity thereof.

Estimation of the maximum number of constant tables with individual table viewpoint:

Additional Indices:

| | |
|---|---|
| T | Set of tables of the line. |
| $C_t$ | Set of component types which are permitted to be fitted at table t, i.e. component types which can be placed by a head which accesses said table. |

Additional Parameters:

| | |
|---|---|
| $Cap_t$ | Space capacity of table t |

Additional Binary Variables:

| | |
|---|---|
| $IsConst_t$ | Variable indicating whether a table is constant. |
| $SetupConst_{c,t}$ | Variable indicating whether the component type c is fitted on the constant tables t. It assumes the value 1 in this case, otherwise the value 0. |
| $SetupVar_{c,r,t}$ | Variable indicating whether the component type c is fitted in the variable fitting portion for the assembly r on the table t. It assumes the value 1 in this case, otherwise the value 0. |

$$\text{maximize} \sum_{t \in T} IsConst_t$$

Under the Condition:

| | | |
|---|---|---|
| (1) | $\sum_{t \in T} SetupConst_{c,t} + SetupVar_{c,r,t} = 1$ | $c \in C, r \in R_c$ |
| (2) | $\sum_{c \in C_t} Width_c \cdot SetupVar_{c,r,t} \leq Cap_t$ | $r \in R, t \in T$ |
| (3) | $\sum_{c \in C_t} Width_c \cdot SetupConst_{c,t} \leq Cap_t$ | $t \in T$ |
| (4) | $SetupConst_{c,t} \leq IsConst_t$ | $c \in C, t \in T$ |
| (5) | $SetupVar_{c,r,t} \leq (1 - IsConst_t)$ | $t \in T$ |
| (6) | $SetupConst_{c,t} = 0$ | $t \in T, c \in C \backslash C_t$ |
| (7) | $SetupVar_{c,r,t} = 0$ | $r \in R, t \in T, c \in C \backslash C_t$ |
| $SetupConst_{c,t} \in \{0,1\}$ | | $t \in T, c \in C$ |
| $SetupVar_{c,r,t} \in \{0,1\}$ | | $r \in R, t \in T, c \in C$ |
| $IsConst_t \in \{0,1\}$ | | $t \in T$ |

Re (1): For an assembly type, all component types contained must be situated either on a constant table or a variable table.

Re (2): The sum of the track widths of the component types on a variable table must not exceed the capacity thereof.

Re (3): The sum of the track widths of the component types on a constant table must not exceed the capacity thereof.

Re (4): Only constantly fitted component types are permitted on constant tables.

Re (5): Only variably fitted component types are permitted on variable tables.

Re (6), (7): Only component types permissible on tables are permitted to be fitted there.

The following supplementary configurations are possible:

Taking account of degrees of filling of the variable and constant tables.

Instead of the assembly types, minimum clusters of assembly types can also be used (e.g. the top side and underside of an assembly, subset of the assemblies which is to be assigned to the same cluster).

The estimators can also be applied to "finished" or "partly finished" clusterings. In this regard, e.g. a cluster method having the combined targets "small number of clusters" and "maximum number of constant tables" is conceivable.

Maximum degree of filling of a fixed fitting (expressed in percent), i.e. the space occupation of the component types of the fixed fitting is permitted to be only this percentage of the entire line capacity.

The implementation of the processes or method sequences described above can be effected on the basis of instructions present on computer-readable storage media or in volatile computer memories (referred to in combination hereinafter as computer-readable memories). Computer-readable memories are for example volatile memories such as caches, buffers or RAM and non-volatile memories such as exchangeable data carriers, hard disks, etc.

The functions or steps described above can be present here in the form of at least one instruction set in/on a computer-readable memory. In this case, the functions or steps are not tied to a specific instruction set or to a specific form of instruction sets or to a specific storage medium or to a specific processor or to specific execution schemes and can be implemented by software, firmware, microcode, hardware, processors, integrated circuits, etc. in standalone operation or in arbitrary combination. In this case, a wide variety of processing strategies can be employed, for example serial processing by a single processor or multi-processing or multitasking or parallel processing, etc.

The instructions can be stored in local memories, but it is also possible to store the instructions on a remote system and access them via a network.

The term "processor", "central signal processing", "control unit" or "data evaluation means", as used here, encompasses processing means in the broadest sense, that is to say for example servers, general purpose processors, graphics processing units, digital signal processors, application-specific integrated circuits (ASICs), programmable logic circuits such as FPGAs, discrete analog or digital circuits and arbitrary combinations thereof, including all other processing means that are known to the person skilled in the art or will be developed in the future. In this case, processors can consist of one or a plurality of devices or facilities or units. If a processor consists of a plurality of devices, the latter can be designed or configured for the parallel or sequential processing or execution of instructions.

Although the invention has been illustrated and described in greater detail with reference to the preferred exemplary embodiment, the invention is not limited to the examples disclosed, and further variations can be inferred by a person skilled in the art, without departing from the scope of protection of the invention.

For the sake of clarity, it is to be understood that the use of "a" or "an" throughout this application does not exclude a plurality, and "comprising" does not exclude other steps or elements.

The claims are as follows:

1. A method for determining a maximum number of constant tables at table locations in one or more pick-and-place lines for the placement of components on assemblies with the aid of pick-and-place machines, wherein the fittings on the constant tables are used in all the fitting families of a pick-and-place line, wherein a fitting family comprises a set of assemblies which can be produced on a pick-and-place line with a common component fitting, wherein a total amount of component types required can be accommodated on table locations available to the pick-and-place line, the method comprising:
   determining the maximum number of constant tables with the aid of mixed integer linear optimization on the basis of input data describing the pick-and-place infrastructure, wherein the pick-and-place infrastructure can comprise in particular the pick-and-place lines having the pick-and-place machines, each having pick-and-place heads, at least one transport system for the assemblies, said constant tables and further tables which can be variably fitted, wherein the following data are used as the input data:
   set of component types,
   set of assembly types,
   set of component types per assembly type,
   track occupation per component type,
   maximum track capacity per table,
   set of tables of a pick-and-place line, and
   set of permissible component types per table,
wherein tables with maximum total track capacity are selected as constant tables.

2. The method as claimed in claim 1, wherein the following parameters are furthermore used as predefinable input parameters for calculating the maximum number of constant tables:
   the maximum degree of filling for the constant tables;
   the maximum degree of filling for the tables which can be variably fitted.

3. The method as claimed in claim 1, wherein minimum clusters are predefinable as further input data for calculating the maximum number of constant tables, wherein a minimum cluster comprises a set of assembly types which have to be produced together in a fitting family.

4. A device for determining a maximum number of constant tables at table locations in one or more pick-and-place lines for the placement of components on assemblies with the aid of pick-and-place machines, wherein the fittings on the constant tables are used in all the fitting families of a pick-and-place line, wherein a fitting family comprises a set of assemblies which can be produced on a pick-and-place line with a common component fitting, wherein a total amount of component types required can be accommodated on table locations available to the pick-and-place line, comprising:
   a pick-and-place infrastructure, which can comprise in particular the pick-and-place lines having the pick-and-place machines, each having pick-and-place heads, at least one transport system for the assemblies, said constant tables and further tables which can be variably fitted, and
   a calculation unit designed to determine the maximum number of constant tables with the aid of mixed integer linear optimization on the basis of input data describing the pick-and-place infrastructure, wherein the following data are used as the input data:
   set of component types,
   set of assembly types,
   set of component types per assembly type,
   track occupation per component type,
   maximum track capacity per table,
   set of tables of a pick-and-place line, and
   set of permissible component types per table,
wherein tables with maximum total track capacity are selected as constant tables.

5. The device as claimed in claim 4, wherein the following parameters are furthermore usable as predefinable input parameters for calculating the maximum number of constant tables:
   the maximum degree of filling for the constant tables;
   the maximum degree of filling for the tables which can be variably fitted.

6. The device as claimed in claim 4, wherein minimum clusters of assembly types are predefinable as further input data for calculating the maximum number of constant tables, wherein a minimum cluster comprises a set of assembly types which are to be produced together in a fitting family.

7. The device as claimed in claim 4, wherein the device is part of a production or mounting line.

8. A computer program product, comprising a computer readable hardware storage device having computer readable program code stored therein, said program code executable by a processor of a computer system to implement a method for determining a maximum number of constant tables at table locations in one or more pick-and-place lines for the placement of components on assemblies with the aid of pick-and-place machines, wherein the fittings on the constant tables are used in all the fitting families of a pick-and-place line, wherein a fitting family comprises a set of assemblies which can be produced on a pick-and-place line with a common component fitting, wherein a total amount of component types required can be accommodated on table locations available to the pick-and-place line, the method comprising:
   determining the maximum number of constant tables with the aid of mixed integer linear optimization on the basis of input data describing the pick-and-place infrastructure, wherein the pick-and-place infrastructure can comprise in particular the pick-and-place lines having the pick-and-place machines, each having pick-and-place heads, at least one transport system for the assemblies, said constant tables and further tables which can be variably fitted, wherein the following data are used as input data:
   set of component types,
   set of assembly types,
   set of component types per assembly type,
   track occupation per component type,
   maximum track capacity er table,
   set of tables of a pick-and-place line, and
   set of permissible component types per table,
      wherein tables with maximum total track capacity are selected as constant tables.

* * * * *